United States Patent [19]
Aipperspach et al.

[11] Patent Number: 5,991,208
[45] Date of Patent: Nov. 23, 1999

[54] WRITE MULTIPLEXER APPARATUS AND METHOD FOR MULTIPLE WRITE PORT PROGRAMMABLE MEMORY

[75] Inventors: Anthony Gus Aipperspach; Peter Thomas Freiburger; Peder James Paulson, all of Rochester, Minn.

[73] Assignee: International Business Machines Corporation, Armonk, N.Y.

[21] Appl. No.: 09/084,134

[22] Filed: May 22, 1998

[51] Int. Cl.⁶ ....................................................... G11C 7/00
[52] U.S. Cl. ................................. 365/189.02; 365/230.05
[58] Field of Search ........................ 365/230.05, 189.02, 365/189.05, 189.08, 230.02

[56] References Cited

U.S. PATENT DOCUMENTS

| | | | |
|---|---|---|---|
| 4,627,030 | 12/1986 | Barber | 365/189 |
| 4,893,280 | 1/1990 | Gelsomini et al. | 365/230.05 |
| 5,216,636 | 6/1993 | Runaldue | 365/230.05 |
| 5,430,685 | 7/1995 | Nakada | 365/230.05 |
| 5,544,122 | 8/1996 | Mizukami et al. | 365/230.05 |
| 5,715,197 | 2/1998 | Nance et al. | 365/189.02 |

*Primary Examiner*—Tan T. Nguyen
*Attorney, Agent, or Firm*—Mark A. Hollingsworth

[57] ABSTRACT

An improved apparatus and method for facilitating multiple write port access to a programmable memory apparatus is disclosed. A memory array, such as a random access memory array, includes a plurality of memory cells. A number of write ports are coupled to the memory array, each of which provides write access to individual memory cells of the memory array. Each of the write ports includes a NAND gate, an inverter, and a transfer gate. The NAND gate includes first and second inputs respectively coupled to a write row select line and a write column select line, and an output coupled to the input of the inverter and a first control input of the transfer gate. The output of the inverter is coupled to a second control input of the transfer gate. The input of the transfer gate is coupled to a data line, and the output of the transfer gate is coupled to a memory cell of the memory array. In response to appropriate logic levels on the write row select line and write column select line, data on the data input line is transferred through the transfer gate and written into the memory cell. Reduced node capacitance at the input of the memory cell and an increase in memory cell write speed are realized by implementing the disclosed write port circuitry.

20 Claims, 9 Drawing Sheets

WRITE MULTIPLEXER APPARATUS AND METHOD FOR MULTIPLE WRITE PORT PROGRAMMABLE MEMORY

FIELD OF THE INVENTION

This invention relates to a programmable memory device, and more particularly, to a multiplexer apparatus and method for a multiple write port programmable memory.

BACKGROUND OF THE INVENTION

Multiple port random access memories are generally configured to include a number of ports, each of which typically represents an independent input/output path for accessing data stored in a memory array. A multiple port RAM may, for example, include a number of read ports and write ports, as well as a scan port for supporting scan-based testing of the memory device. It is noted that the number of read ports need not be the same as the number of write ports.

A significant problem encountered when attempting to increase the number of write ports for providing write access to a programmable memory array concerns the node capacitance at the input of the memory cells. In general, the capacitance at the input of a given memory cell increases with each additional write port connected thereto. Such increases in input node capacitance of the memory cell generally results in an appreciable degradation in memory cell write speed.

Another significant problem that arises when attempting to increase the number of write ports to a programmable memory array concerns a heightened potential of compromising data integrity or data stability within the memory cell that may occur during a charge sharing event. A write port for a conventional multiple write port RAM, for example, typically includes a pair of series connected transfer gates. Under certain conditions, a charge sharing event may occur in which the cumulative capacitance at the memory cell input and at a node defined between the two transfer gates may contribute to an inadvertent and potentially catastrophic flipping of the memory cell state.

Various conventional write port designs have heretofore failed to adequately address the undesirable increase in memory cell input capacitance and concomitant reduction in memory write speeds in multiple write port programmable memory devices. There is, therefore, a need for improved write port circuitry for multiple write port RAM applications which provides for reduced circuit capacitance and memory cell input capacitance, good performance and noise characteristics, and one that does not result in an increase in circuit element size or number of transistors. The present invention fulfills these and other needs.

SUMMARY OF THE INVENTION

The present invention is directed to an improved circuit for facilitating multiple write port access to a programmable memory apparatus. A memory array, such as a random access memory array, includes a plurality of memory cells. A number of write ports are coupled to the memory array, each of which provides write access to individual memory cells of the memory array. Each of the write ports includes a NAND gate and an inverter coupled to a transfer gate.

The NAND gate includes first and second inputs respectively coupled to a write row select line and a write column select line, and an output coupled to the input of the inverter and a first control input of the transfer gate. The output of the inverter is coupled to a second control input of the transfer gate. The input of the transfer gate is coupled to a data line, and the output of the transfer gate is coupled to a memory cell of the memory array. In response to appropriate logic levels on the write row select line and write column select line, data on the data input line is transferred through the transfer gate and written into the memory cell.

A write port for a multiple write port programmable memory according to the present invention provides for reduced node capacitance at the input of the memory cell and an increase of the speed at which data is written to the memory cell via the write port. Various technologies may be used to implement the write port circuitry of the present invention, including a complementary metal-oxide semiconductor (CMOS) technology. The write port implemented in accordance with the principles of the present invention may be utilized to provide write port functionality for a variety of programmable memory device types, including static random access memory and dynamic random access memory.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

While the invention is amenable to various modifications and alternative forms, specifics thereof have been shown by way of example in the drawings and will be described in detail hereinbelow. It is to be understood, however, that the intention is not to limit the invention to the particular embodiments described. On the contrary, the invention is intended to cover all modifications, equivalents, and alternatives falling within the spirit and scope of the invention as defined by the appended claims.

DETAILED DESCRIPTION OF THE VARIOUS EMBODIMENTS

In the following description of the illustrated embodiments, references are made to the accompanying drawings which form a part hereof, and in which is shown by way of illustration, various embodiments in which the invention may be practiced. It is to be understood that other embodiments may be utilized, and structural and functional changes may be made without departing from the scope of the present invention.

Figure 1:
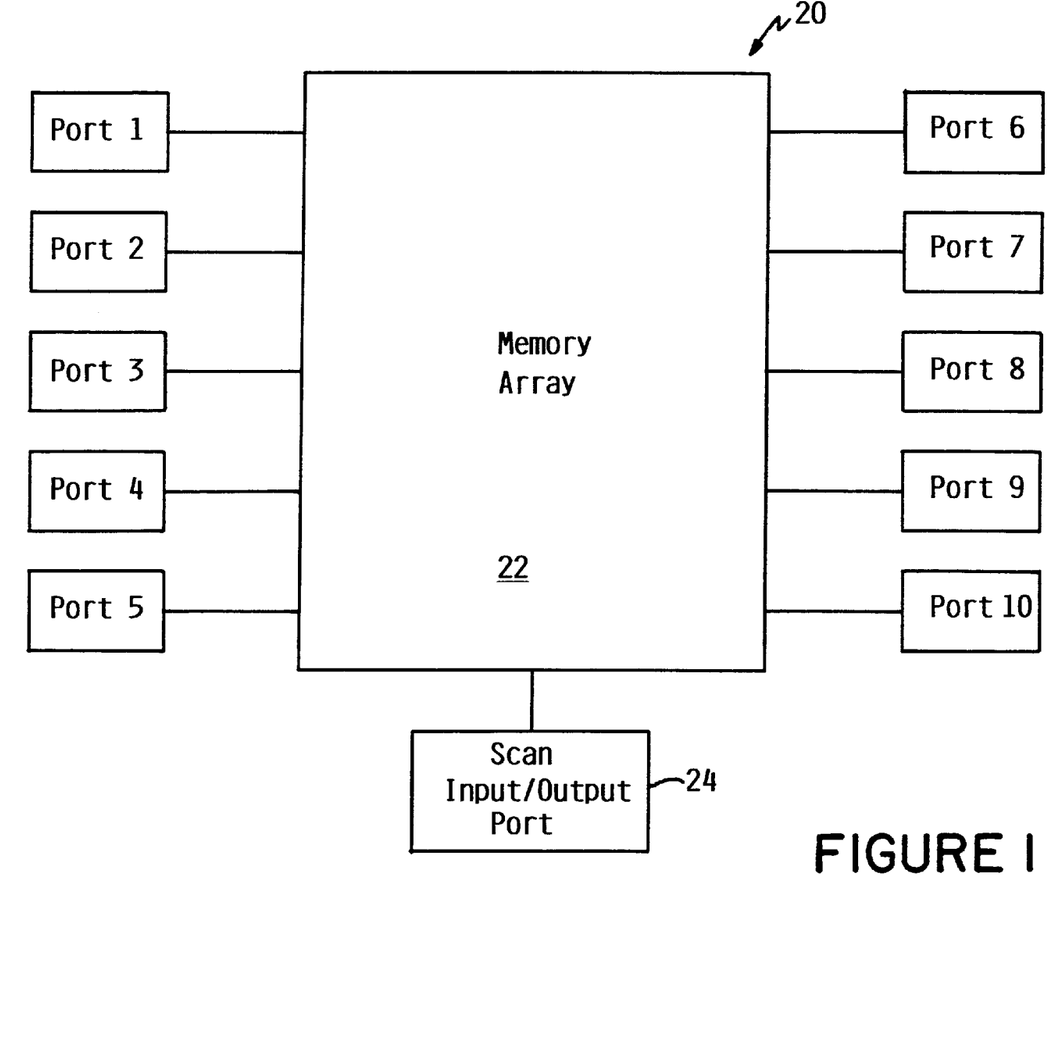
FIG. 1 is a generalized block diagram of a multi-port programmable memory device including a number of read and write ports for accessing a memory array.

Referring now in detail to the drawings, and in particular to FIG. 1, there is shown a multi-port programmable memory device 20 including a memory array 22 to which is coupled a number of ports for accessing the memory array 22. The programmable memory device 20 is intended to represent any type of programmable memory having multiple write ports within which write port circuitry in accordance with the principles of the present invention may be implemented. It is to be understood that a multiple write port programmable memory device 20 within the context of the present invention may be implemented in any memory technology, such as a CMOS technology or any other technology of programmable storage devices.

The memory device illustrated in FIG. 1, for example, may represent an LSSD (level sensitive scan design) memory array 22 to which a scan input/output port 24 may be coupled. An LSSD memory device is understood in the art to represent a memory implementation that provides for a comprehensive level of memory element or latch testing using scan-based testing techniques. A memory device designed in accordance with typical LSSD principles provides for a high degree of observability and controllability. Observability refers to the degree to which one can observe a particular node of internal circuitry at the outputs or pins of the circuit. Controllability refers to a measure of the ease by which a particular node of internal circuitry may be set to a 1 state or 0 state. It is to be understood that a write port design according to the present invention may be implemented in any scannable or non-scannable programmable memory device.

The multi-port programmable memory device 20 shown in FIG. 1 includes ports 1–10 coupled to memory array 22. In accordance with this illustrative embodiment, the memory device 20 includes five read ports, ports 1–5, and five write ports, ports 6–10, as well as a scan input/output port 24. The implications of providing multiple port access to memory cells defined within memory array 22 may be appreciated by referencing FIG. 2.

Figure 2:
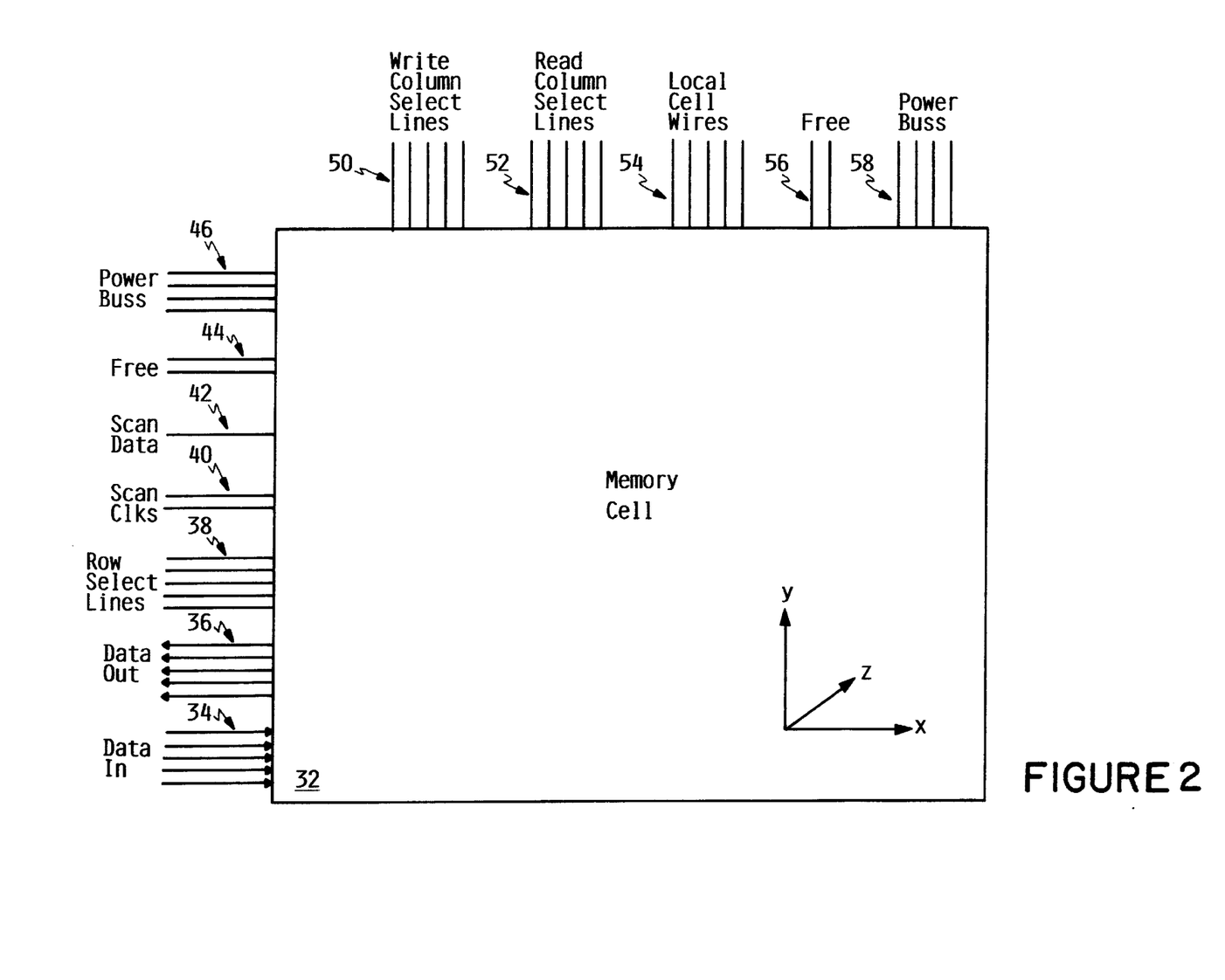
FIG. 2 is a depiction of a single memory cell of a multi-port programmable memory and its associated wiring configuration for facilitating multi-port access to the memory cell.

As is shown in the illustrative embodiment of FIG. 2, each memory cell 32 of memory array 22 is interconnected with ports 1–10 and scan input/output port 24 through a complex wiring arrangement. It may be useful to view the wiring configuration that provides external access to memory cell 32 in terms of x, y, and z planes defining the three-dimensional memory cell 32. Running generally along the y-axis or vertical plane of memory cell 32 is a first set of wires or conductors. A second set of conductors runs generally along the x-axis or horizontal plane of memory cell 32.

The set of conductors running along the x-axis of memory cell 32 includes five data input lines 34 and five data output lines 36. The set of conductors running along the horizontal plane of memory cell 32 also includes write row select lines 38, scan clock lines 40, a scan data line 42, two free or unassigned lines 44, and four power bus lines 46. The set of conductors running along the y-axis or vertical plane of memory cell 32 includes five write column select lines 50 and five read column select lines 52. Other conductors running along the vertical plane of memory cell 32 include local cell conductors 54, a pair of free or unassigned conductors 56, and four power bus conductors 58.

It is understood that the horizontal and vertical conductors are typically oriented so as to be physically separated with respect to the z-axis of memory cell 32. It will be readily appreciated by those skilled in the art that a multi-port memory array which employs 24 horizontally oriented conductors and 25 vertically oriented conductors for interconnecting individual memory cells 32 presents several challenges to the circuit designer.

One particular challenge concerns the problem of adding additional write ports to the memory array 22 while keeping memory cell input node capacitance sufficiently low in order to maintain acceptable performance and noise margins. Another complicating factor when adding additional write ports to memory array 22 concerns minimizing charge sharing so as to provide for a requisite level of data stability.

Figure 3:
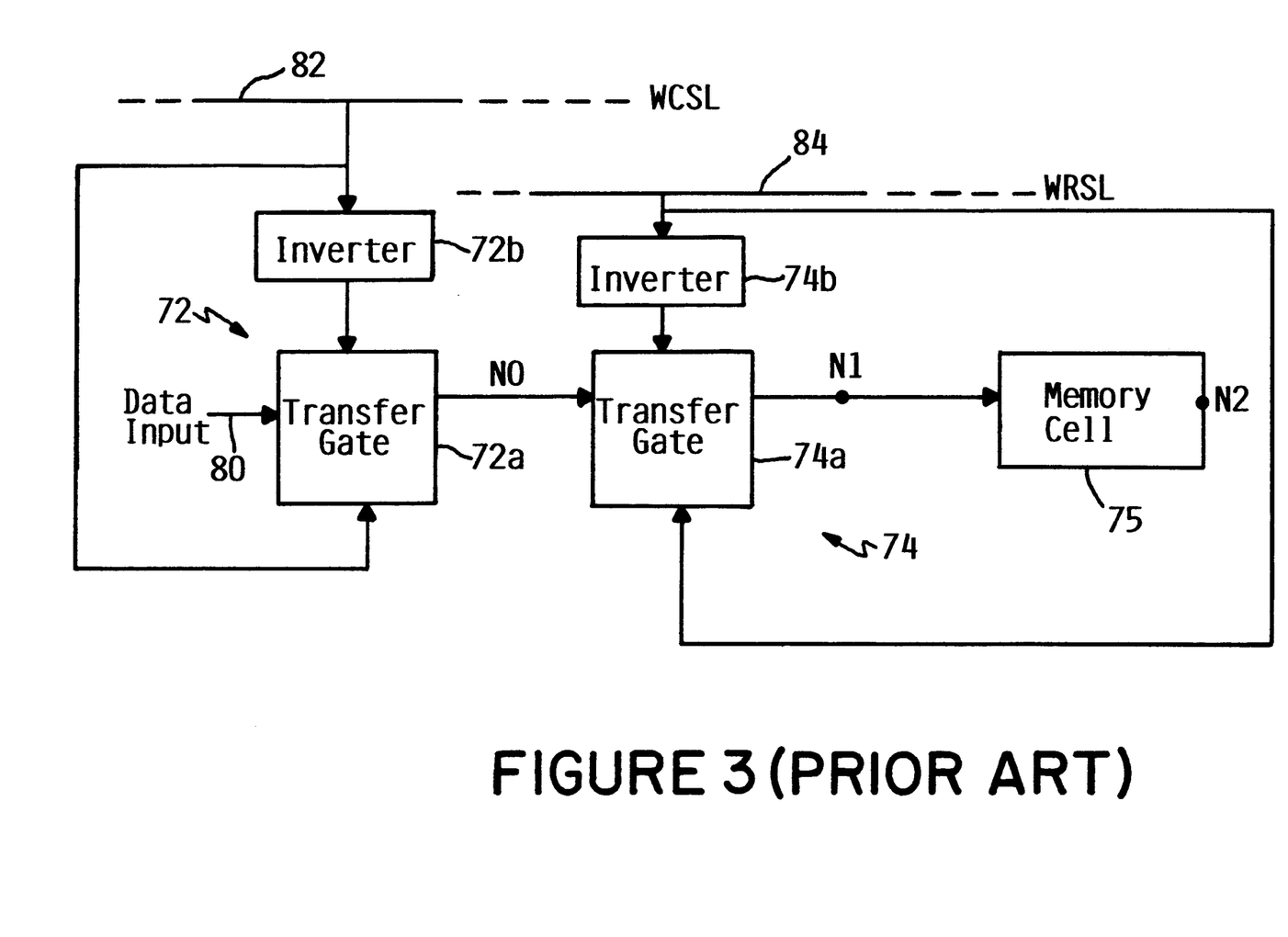
FIG. 3 illustrates the configuration of a conventional write port for writing data to a memory cell of a random access memory.
Figure 4:
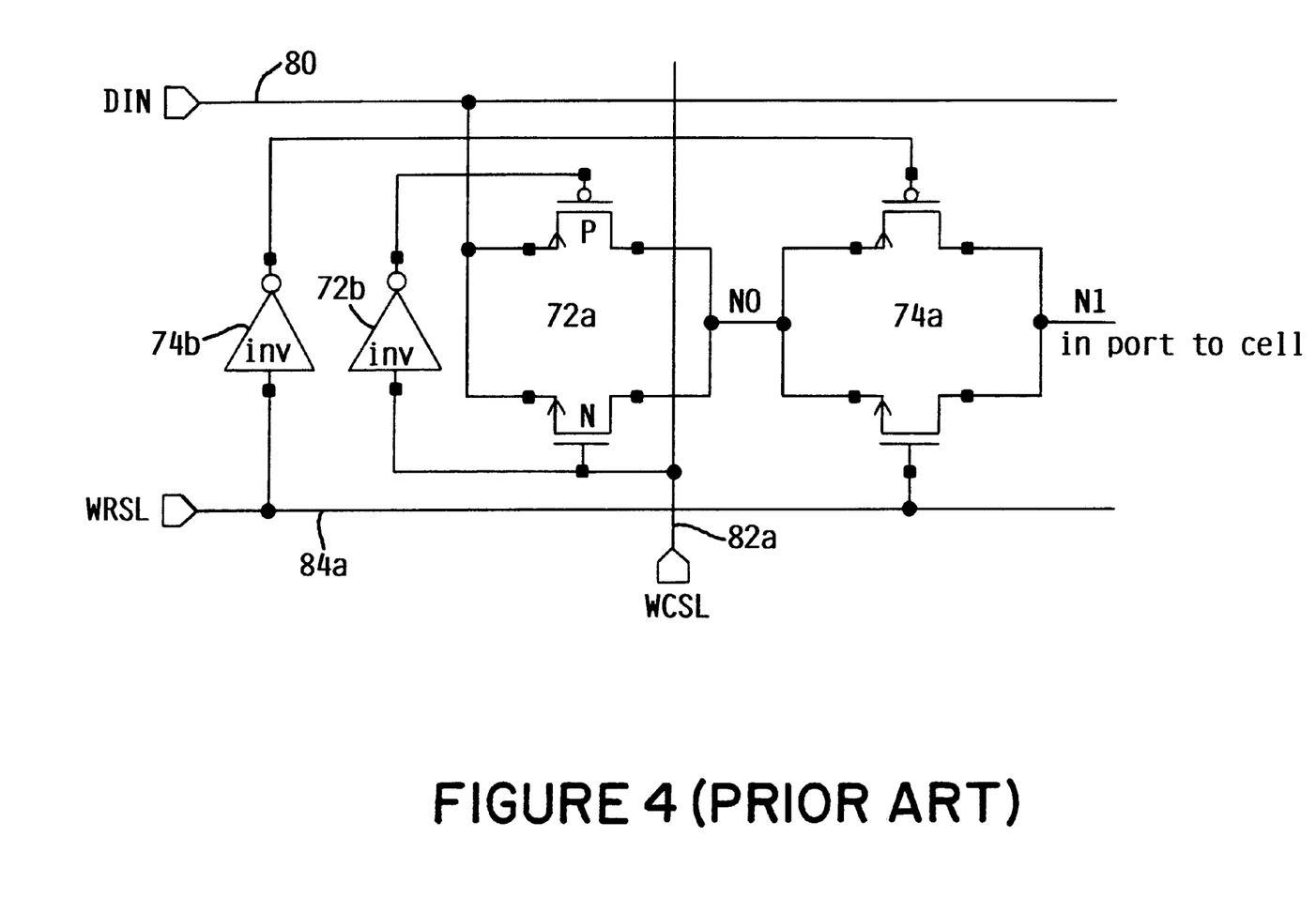
FIGS. 4–5 illustrate embodiments of conventional write port circuitry employing a pair of transfer gates and associated inverters for writing data to a memory cell of a random access memory.
Figure 5:
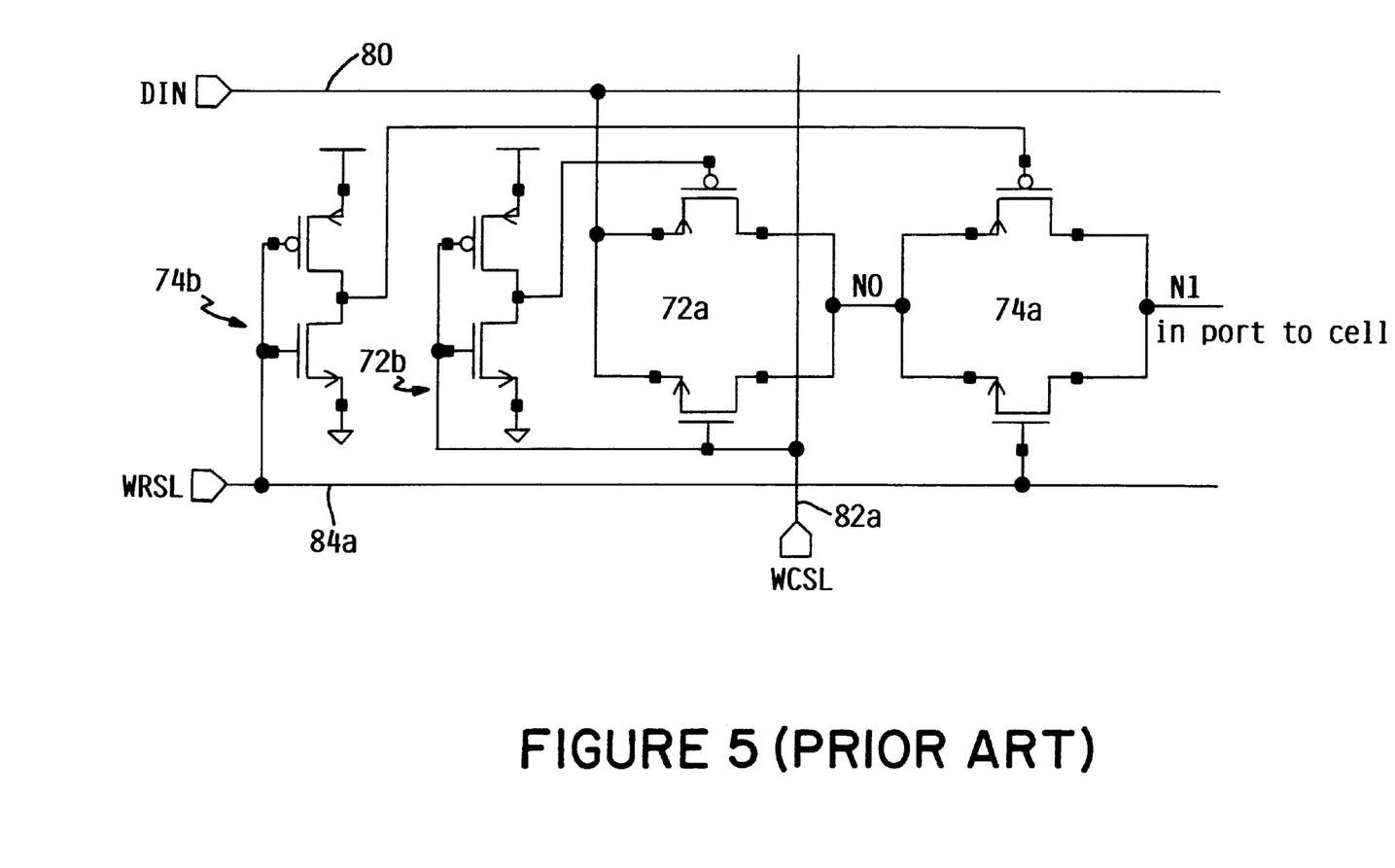

The circuit block diagram depicted in FIG. 3 represents a traditional approach to implementing a write port for a scannable memory array, such as an LSSD memory device. FIGS. 4 and 5 illustrate in schematic form the conventional write port circuit shown in FIG. 3. The implementation shown in FIGS. 3–5 includes two transfer gate circuits 72, 74 connected in series. Each of the transfer gate circuits 72, 74 of a conventional write port design includes a respective transfer gate 72a, 74a connected to an associated inverter 72b, 74b.

The first transfer gate circuit 72 is connected to write column select line (WCSL) 82, and the second transfer gate circuit 74 is connected to write row select line (WRSL) 84. A data line 80 is shown connected to an input of the first transfer gate circuit 72. Data received from data line 80 is transferred to memory cell 75 in response to the logic states of write row select line 84 and write column select line 82.

In accordance with a conventional approach, every write port coupled to memory array 22 includes the additional pair of transfer gates 72a, 74a and associated inverters 72b, 74b. Increasing the capacitance at node N1 concomitantly increases the difficulty of pulling node N1 from its current logic state to an opposite logic state. In order to do so, the cumulative capacitance at node N1 and the memory cell inverter thresholds must be overcome.

It is understood that two transfer gate circuits 72, 74 connected in series generally provides for poor conductance, and typically requires usage of relatively large transistors. Increasing the size of the transfer gate transistors, in turn, has the adverse affect of increasing the capacitance at node N1.

Another problem associated with a write port design associated with a traditional implementation concerns the speed at which data is written to the memory cell 75. For example, the entire active portion of the clock signal may be utilized to perform the operation of writing data to memory cell 75. In a more complex case in which a write through operation is desired, the speed at which memory cell 75 flips state becomes of significant importance.

In general, a desirable write port circuit implementation permits the memory cell 75 to flip state as fast as possible to make best use of the write through time available during the active portion of the clock signal. The speed at which memory cell 75 is able to flip state is a function of the capacitance at node N1 and the conductance of transfer gate circuits 72, 74. A traditional write port design, such as that illustrated in FIGS. 3–5, results in relatively high N1 node capacitance and poor transfer gate conductance, resulting in slower write speeds that may limit the efficacy of a given write through methodology.

In addition to the capacitance at node N1, the designer must be concerned with the capacitance at node N0 between transfer gate circuits 72, 74 of each write port. It can be seen that any time that transfer gate circuit 74 of a given write port is in an ON state, the capacitance at node N0 must be accounted for and added to the total capacitance of the write port circuitry. In addition to increased capacitance associated with a traditional write port design, the conventional write gate circuit implementation shown in FIGS. 3–5 is susceptible to unintended and erroneous flipping of states during a charge sharing event.

By way of example, it is assumed that for the previous cycle, all of the write column select lines 82 were ON, all of the write row select lines were OFF, and the data input to the transfer gate circuit 72 of all write ports was 0. In this case, the N0 nodes of all write ports are charged, or in this case discharged, to 0 volts. It is also assumed that the node N1 of memory cell 75 is at the potential $V_{DD}$. In the next cycle, it is assumed that the write row select line transitions to an ON state and the write column select line 82 transitions to an OFF state for all write ports so that all nodes N0 draw a charge from node N1. If this charge draw causes the voltage at node N1 to drop far enough, such a voltage drop will cause the memory cell 75 to flip state. It can be appreciated that such a charge sharing scenario is both undesirable and hazardous.

Figure 6:
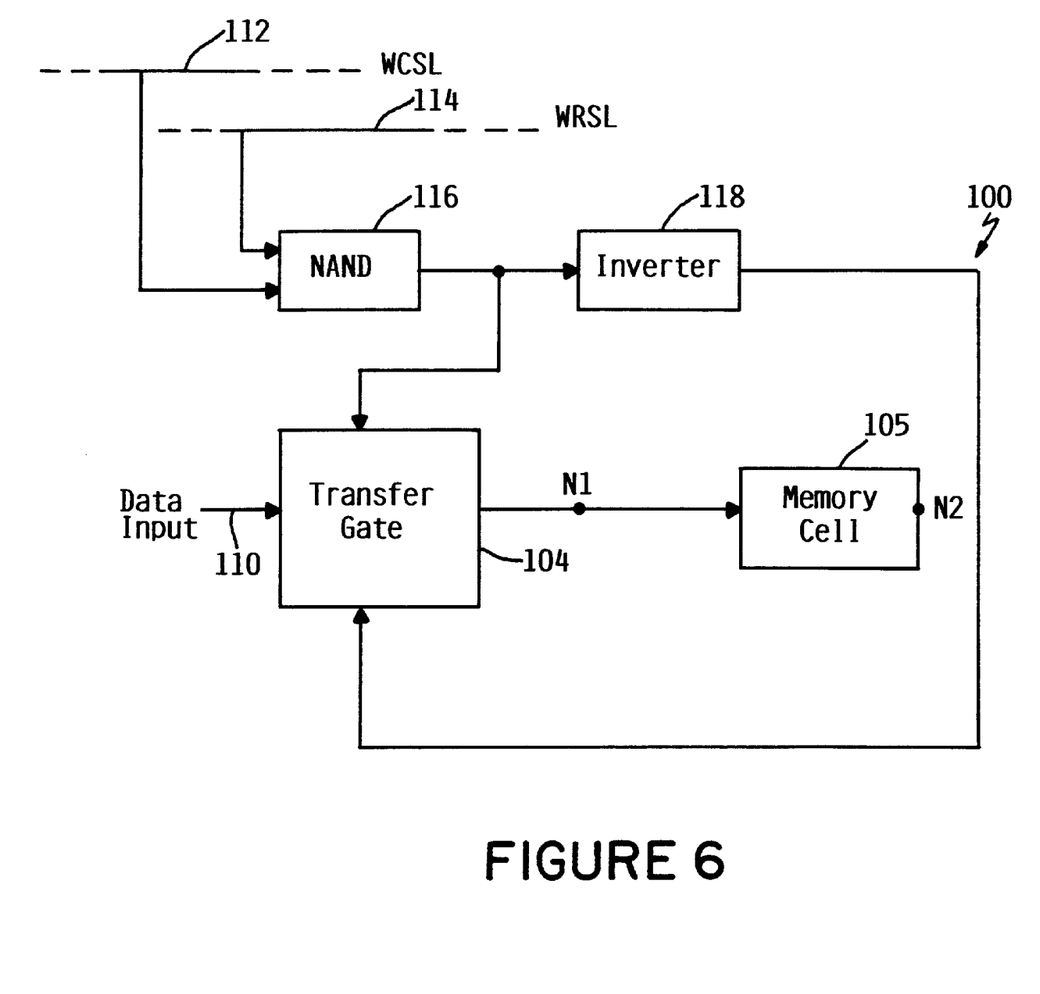
FIG. 6 is a block diagram of a write port for writing data to a memory cell of a programmable memory device in accordance with one embodiment of the present invention.

The above-described problems associated with traditional approaches to implementing a write port for a scannable memory array are obviated by implementing write port circuitry in accordance with the principles of the present invention. FIG. 6 illustrates in block diagram form an exemplary embodiment of a write port for a multiple write port programmable memory according to the present invention. In accordance with the embodiment shown in FIG. 6, a single transfer gate 104 is employed for each write port of a multiple write port random access memory. In addition to reducing the number of transfer gates of a conventional design from two to one, the number of inverters is reduced in number from two to one.

The write port circuit 100 shown in FIG. 6 includes a dual input NAND gate 116 with a first input coupled to write column select line 112 and a second input coupled to write row select line 114. The output of NAND gate 116 is coupled to an inverter 118 and to a first control input of transfer gate 104. The output of inverter 118 is coupled to a second control input of transfer gate 104. The transfer gate 104 has an input coupled to a data line 110. The output of transfer gate 104 is coupled to a memory cell 105.

The single transfer gate write port configuration, which includes NAND gate 116 and inverter 118, may be advantageously implemented for each write port of a multiple write port programmable memory apparatus. In an exemplary multiple port implementation, a number of the single transfer gate write ports 100 are coupled to node N1 at the input of the memory cell 105 to provide multiple write access to the memory cell 105.

Replacing the two series transfer gates 72a, 74a with a single transfer gate 104 of reduced size significantly reduces the capacitance at node N1 at the input of memory cell 105. Further, a write port implemented in accordance with the principles of the present invention completely eliminates the aforementioned charge sharing problem associated with prior art write port designs.

Figure 7:
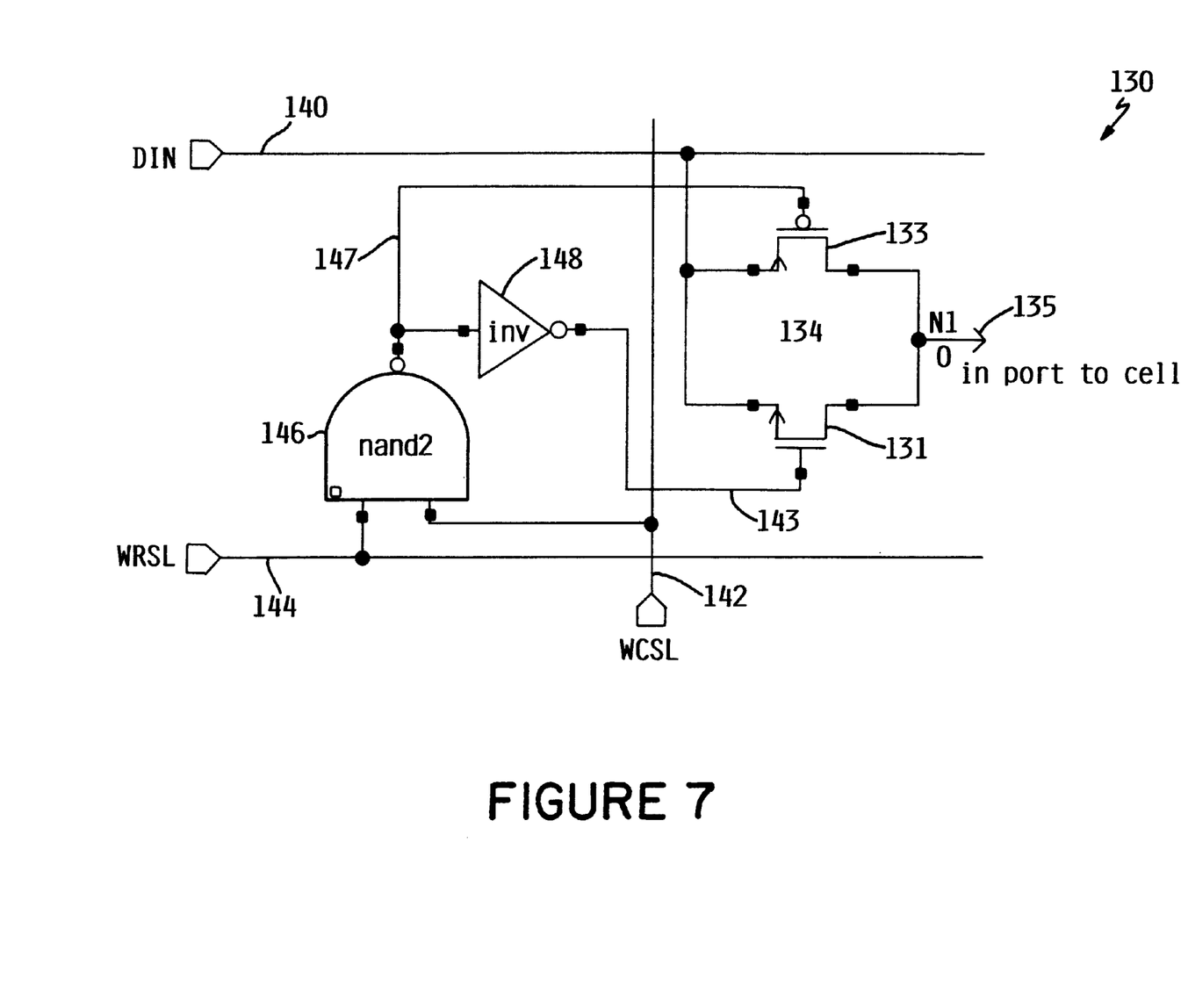
FIG. 7 is a schematic illustration of a write port circuit for writing data to a memory cell of a programmable memory device in accordance with another embodiment of the present invention.

FIG. 7 is a schematic depiction of the write port circuitry shown in FIG. 6. As is shown in FIG. 7, the write port circuitry 130 includes a dual input NAND gate 146 having first and second inputs coupled to write row select line (WRSL) 144 and write column select line (WCSL) 142, respectively. The output of NAND gate 146 is coupled to the input of inverter 148 and to the gate of P-channel transistor 133 via conductor 147. The output of NAND gate 146 is also coupled to the input of inverter 148 which, in turn, is coupled to the gate of N-channel transistor 131 via conductor 143.

In the configuration illustrated in FIG. 7, the P-channel transistor 133 and N-channel transistor 131 constitute a CMOS transmission gate. The signal produced at the output of NAND gate 146 may be viewed as a control signal that controls the operation of the transmission gate 134. In particular, the control signal, and its complement produced at the output of inverter 148, are respectively applied to the gates of transistors 133 and 131 in response to the logic state of write row select line 144 and write column select line 142.

It can be seen that the write port circuitry 130 shown in FIG. 7 initiates writing of data from data line 140 to the memory cell (not shown) at the output of transmission gate 134 in response to a high logic state applied to both write row select line 144 and write column select line 142. The logic state of the memory cell remains unchanged in response to NAND gate inputs other than high logic level inputs applied to the NAND gate 146.

Figure 8:
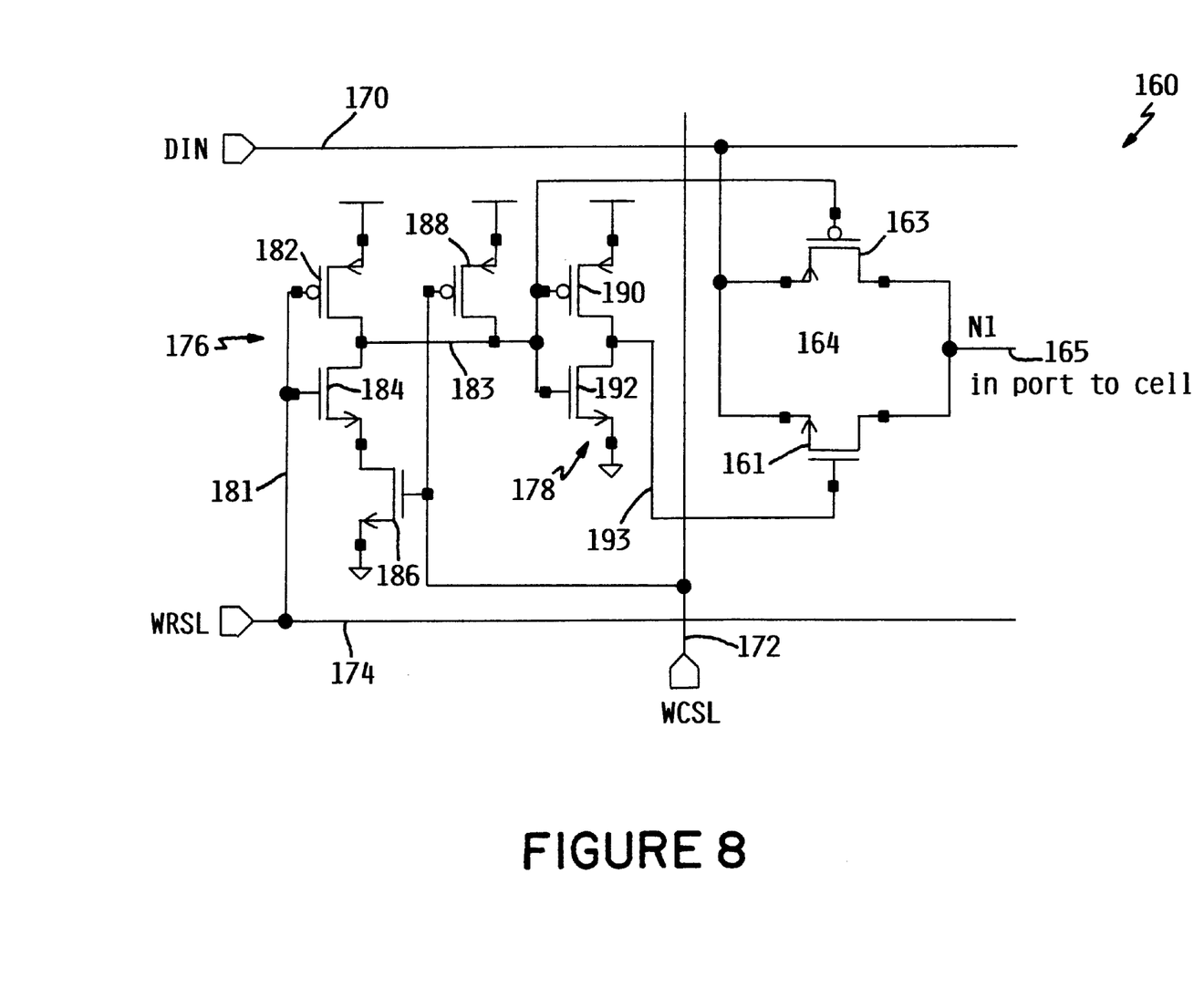
FIG. 8 is a transistor-level schematic illustration of a write port for writing data to a memory cell of a programmable memory device in accordance with a further embodiment of the present invention.

Another embodiment of write port circuitry in accordance with the principles of the present invention is illustrated in the schematic illustration provided in FIG. 8. In this embodiment, NAND gate 176 is implemented using two P-channel MOSFET transistors 182, 188 and two N-channel MOSFET transistors 184, 186. The inverter 178 is implemented using one P-channel MOSFET transistor 190 and a single N-channel MOSFET transistor 192. By comparing the prior art write port circuitry shown in FIG. 5 with the write port circuitry of the present invention shown in FIG. 8, it can be seen that the advantages realized by implementing a write port according to the present invention are achieved with no net increase in the number of transistors needed to implement the write port circuit 160.

More specifically, the conventional twin transfer gate implementation shown in FIG. 5 requires two transistors for each transfer gate 72a, 74a. In addition, each of the inverters 74b and 72b is implemented using two transistors. As such, the conventional write port circuit shown in FIG. 5 requires a total of eight transistors per write port. Turning to FIG. 8, the write port circuit 160 in accordance with one embodiment of the present invention includes a single transfer gate 164 implemented using two transistors 163, 161. The inverter 178 includes two transistors 190, 192. In addition, the NAND gate 176 includes four transistors 182, 184, 186, 188. As such, a total of eight transistors are employed to implement the circuitry 160 for each write port.

As was previously discussed, write port circuitry implemented in accordance with the principles of the present invention advantageously reduces the capacitance at the memory cell input node and provides for increased memory cell write speed. To assist in demonstrating these and other advantages of the present invention, circuit simulation software was employed to model conventional write port circuitry and write port circuitry of the present invention. The schematic of FIG. 9 illustrates these two circuits, the performance of which was recorded and is summarized below in Table 1.

Figure 9:
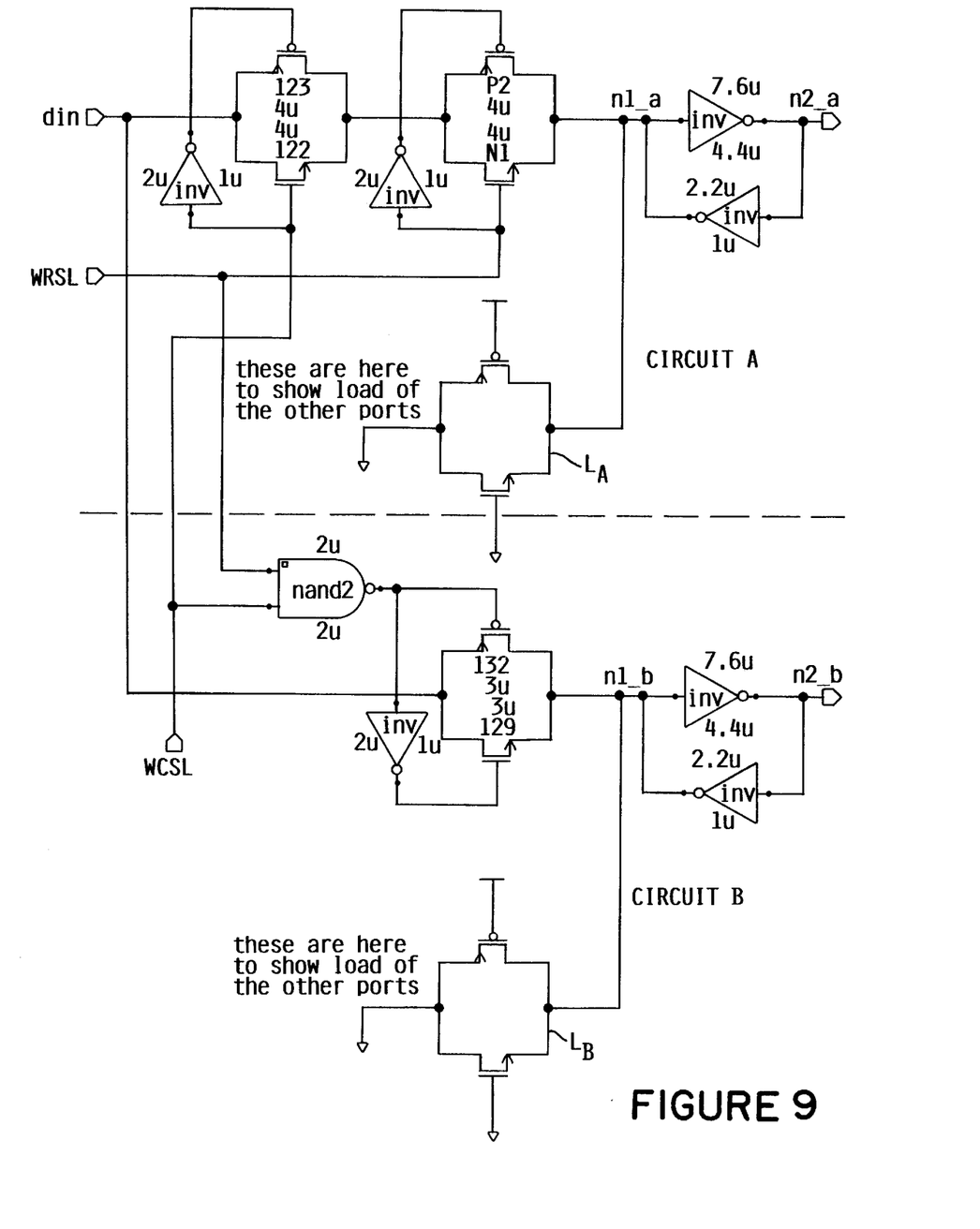
FIG. 9 is a schematic illustration of a prior art write port circuit, Circuit A, and a write port circuit of the present invention, Circuit B, which are exercised by simulation software to demonstrate the advantages of the multiple write port circuitry implemented in accordance with the principles of the present invention.

The circuitry illustrated in FIG. 9 was developed using SPICE-like circuit analysis and simulation software. The upper portion of the circuitry shown in FIG. 9, Circuit A, simulates a conventional dual transfer gate write port, such as that shown in FIG. 4. The lower portion of the circuitry simulates write port circuitry in accordance with one embodiment of the present invention, and is substantially similar to that shown in FIG. 7.

Node n1_a of Circuit A includes a simulated load, $L_A$, representative of loading from other conventional write ports, each with their respective transfer gates turned OFF. The load transfer gate, $L_A$, is reiterated five times to simulate total loading of six conventional write ports at node n1_a. Node n1_b of Circuit B also includes a simulated load, $L_B$, representative of loading from other write ports of the present invention, each with their respective single transfer gate turned OFF. The load transfer gate, $L_B$, is reiterated five times to simulate total loading of six write ports of the present invention at node n1_b.

The inputs, din, WRSL, and wcsl, are shared by the two Circuits A and B, and are driven by the simulator. The output nodes, n2_a and n2_b are loaded with a 0.1 pf capacitor to simulate the loading at these nodes. The measurements tabulated in Table 1 below are taken from the mid-point (i.e., fifty percent of $V_{DD}$) of the last arriving input to the n2 nodes switching through seventy-five percent of the total voltage swing. If the output is transitioning from high to low, the output measurement point is taken at twenty-five percent of $V_{DD}$.

The width of the transistors illustrated in FIG. 9 are indicated in terms of microns. For example, the term 4u positioned next to a transistor indicates that the transistor has a channel width of 4 microns. The channel length of each of the transistors is 0.5 micron. The term positioned on top of the NAND gate and the inverters represents the width of the p-channel FETs, and the term positioned on the bottom of the NAND gate and the inverters represents the width of the n-channel FETs. The time measurements presented in Table 1 below are given in terms of nanoseconds. The relative capacitance represents the summation of the widths of all transistors connected to each of the n1 nodes. Gate and diffusion capacitance is assumed to be the same for a first order approximation. The simulation ignores any additional capacitance due to charge sharing.

TABLE 1

| Transition time (nanoseconds) | Improved Write Port Transistor Width 3 microns | Prior Art Write Port Transistor Width | | | |
|---|---|---|---|---|---|
| | | 3 microns | 4 microns | 5 microns | 6 microns |
| din rise to n2 fall | 0.461 | 0.845 | 0.683 | 0.605 | 0.592 |
| din fall to n2 rise | 0.420 | 0.574 | 0.512 | 0.478 | 0.455 |
| wcsl rise to n2 fall | 0.622 | 0.920 | 0.762 | 0.687 | 0.644 |
| wcsl rise to n2 rise | 0.548 | 0.570 | 0.506 | 0.470 | 0.447 |

TABLE 1-continued

| Transition time (nanoseconds) | Improved Write Port Transistor Width 3 microns | Prior Art Write Port Transistor Width | | | |
|---|---|---|---|---|---|
| | | 3 microns | 4 microns | 5 microns | 6 microns |
| WRSL rise to n2 fall | 0.630 | 0.889 | 0.733 | 0.658 | 0.613 |
| WRSL rise to n2 rise | 0.547 | 0.547 | 0.489 | 0.456 | 0.434 |
| relative capacitance | 51.2 | 51.2 | 63.2 | 75.2 | 87.2 |

The transition time measurements tabulated in Table 1 demonstrate that the write port circuit implemented in accordance with the principles of the present invention provides for a significant overall improvement in performance when compared to conventional write port implementations. The write port circuitry of the present invention thus provides for increased memory cell write speeds in addition to the other advantages describe previously, such as increased data stability.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A multiple write port programmable memory apparatus, comprising:
   a plurality of memory cells; and
   a plurality of write ports coupled to the memory cells, each of the write ports comprising:
      a NAND gate having an output, a first input, and a second input;
      an inverter having an output, and a input coupled to the output of the NAND; and
      a transfer gate including a first control input coupled to the output of the inverter and a second control input coupled to the output of the NAND gate, the transfer gate further including an input coupled to a data line and an output coupled to a memory cell of the plurality of memory cells, the transfer gate, in response to first and second control signals respectively applied to the first and second control inputs, transferring data from the data line to the memory cell.

2. The apparatus of claim 1, wherein the NAND gate comprises four transistor, the inverter comprises two transistors, and the transfer gate comprises 2 transistors.

3. The apparatus of claim 2, wherein the NAND gate, the inverter, and the transfer gate are respectively implemented in complimentary metal-oxide semiconductor technology.

4. The apparatus of claim 1, wherein the plurality of memory cells are implemented as scannable or non-scannable memory cells.

5. The apparatus of claim 1, wherein the programmable memory apparatus further comprises at least one scan input/output port.

6. The apparatus of claim 1, wherein the plurality of write ports includes at least six write ports.

7. The apparatus of claim 1, wherein the plurality of write ports are implemented in a below 1 micron complimentary metal-oxide semiconductor technology.

8. The apparatus of claim 1, wherein the memory cell comprises a random access memory cell.

9. The apparatus of claim 1, wherein the memory cell comprises a static random access memory cell.

10. The apparatus of claim 1, wherein the memory cell comprises a dynamic random access memory cell.

11. The apparatus of claim 1, wherein the memory cell is implemented in complimentary metal-oxide semiconductor technology.

12. A random access memory apparatus including a write port coupled to at least one random access memory cell, the write port comprising:

a NAND gate including an output, a first input, and a second input;

an inverter including an output, and a input coupled to the output of the NAND; and a transmission gate including a first control input coupled to the output of the inverter and a second control input coupled to the output of the NAND gate, the transmission gate further including an input coupled to a data line and an output coupled to a memory cell of the plurality of memory cells, the transmission gate, in response to first and second control signals respectively applied to the first and second control inputs, transferring data from the data line to the memory cell.

13. The apparatus of claim 12, wherein the NAND gate comprises four transistor, the inverter comprises two transistors, and the transmission gate comprises 2 transistors.

14. The apparatus of claim 13, wherein the NAND gate, the inverter, and the transmission gate are respectively implemented in complimentary metal-oxide semiconductor technology.

15. The apparatus of claim 13, wherein the memory cell comprises a static random access memory cell or a dynamic random access memory cell.

16. The apparatus of claim 13, wherein the memory cell is implemented as a scannable or non-scannable memory cell.

17. The apparatus of claim 13, wherein the random access memory apparatus further comprises at least one scan input/output port.

18. The apparatus of claim 13, wherein the random access memory apparatus further comprises a plurality of the write ports.

19. The apparatus of claim 13, wherein the random access memory apparatus further comprises at least six of the write ports.

20. A method of writing data to a random access memory including at least one memory cell coupled to a write column select line and a write row select line, the memory cell being write accessible via a write port of a plurality of write ports coupled to the random access memory, the method comprising:

generating a selection signal on each of the write column select line and the write row select line;

performing a NAND function on the selection signals to produce a NAND output signal;

inverting the NAND output to produce an inverted NAND output signal; and transferring, in response to the NAND output signal and the inverted NAND output signal, a data signal from a write data line to the memory cell.

* * * * *